United States Patent
Watanabe

(10) Patent No.: US 11,054,283 B2
(45) Date of Patent: Jul. 6, 2021

(54) MAGNETIC SENSOR

(71) Applicant: TDK Corporation, Tokyo (JP)

(72) Inventor: Kazuya Watanabe, Tokyo (JP)

(73) Assignee: TDK Corporation, Tokyo (JP)

( * ) Notice: Subject to any disclaimer, the term of this patent is extended or adjusted under 35 U.S.C. 154(b) by 151 days.

(21) Appl. No.: 16/182,759

(22) Filed: Nov. 7, 2018

(65) Prior Publication Data

US 2019/0137299 A1 May 9, 2019

(30) Foreign Application Priority Data

Nov. 9, 2017 (JP) .................................. 2017-216488

(51) Int. Cl.
| | | |
|---|---|---|
| *G01D 5/16* | (2006.01) | |
| *G01R 33/09* | (2006.01) | |
| *G01D 5/14* | (2006.01) | |

(52) U.S. Cl.
CPC .............. *G01D 5/16* (2013.01); *G01D 5/145* (2013.01); *G01R 33/093* (2013.01)

(58) Field of Classification Search
CPC ...... G01D 5/145; G01R 33/091; G01R 33/098
See application file for complete search history.

(56) References Cited

U.S. PATENT DOCUMENTS

| | | | | |
|---|---|---|---|---|
| 2002/0159206 A1* | 10/2002 | Shimazawa | ............ | B82Y 25/00 360/324.12 |
| 2013/0307098 A1* | 11/2013 | Lee | .......................... | H01L 43/08 257/421 |
| 2015/0061053 A1* | 3/2015 | Nakayama | .............. | H01L 45/06 257/421 |
| 2015/0192432 A1* | 7/2015 | Noguchi | ................ | G01R 33/09 324/207.2 |

FOREIGN PATENT DOCUMENTS

| | | |
|---|---|---|
| CN | 104764470 A | 7/2015 |
| JP | H11-087804 A | 3/1999 |
| JP | 2009-300150 A | 12/2009 |
| JP | 2015-129697 A | 7/2015 |
| WO | 2016/024621 A1 | 2/2016 |

* cited by examiner

*Primary Examiner* — Alvaro E Fortich
(74) *Attorney, Agent, or Firm* — Posz Law Group, PLC

(57) ABSTRACT

A magnetic sensor according to the invention comprises at least an element portion that is elongate and that has a magnetoresistive effect; and a soft magnetic body that sandwiches the element portion on both sides with regard to a short axis direction of the element portion. A width of at least one of both end portions of the element portion with regard to a long axis direction of the element portion gradually decreases as a distance in the long axis direction from a central portion of the element portion with regard to the long axis direction increases.

16 Claims, 12 Drawing Sheets

MAGNETIC SENSOR

BACKGROUND OF THE INVENTION

Field of the Invention

The present application is based on, and claims priority from, JP Application No. 2017-216488, filed on Nov. 9, 2017, the disclosure of which is hereby incorporated by reference herein in its entirety.

The present invention relates to a magnetic sensor.

Description of the Related Art

As a sensor for detecting the position of a moving object, a magnetic sensor that has an element having a magnetoresistive effect is known (see JPH11-87804). A magnetic sensor moves relative to a magnet and thereby detects a change in an external magnetic field that is generated by the magnet, and calculates the moving distance of the moving object based on the change in the external magnetic field that is detected.

The magnetic sensor that is disclosed in JPH11-87804 has a giant magnetoresistive thin film that exhibits a magnetoresistive effect and soft magnetic thin films, as shown in FIG. 1 thereof. In the magnetic sensor, the giant magnetoresistive thin film is elongate and the soft magnetic thin films are provided on both sides of the giant magnetoresistive thin film with regard to the short axis direction thereof. The giant magnetoresistive thin film is rectangular, as viewed in the thickness direction. In this magnetic sensor, the giant magnetoresistive thin film, which has poor sensitivity to a magnetic field, is combined with soft magnetic thin films in order to enhance the sensitivity to a magnetic field.

SUMMARY OF THE INVENTION

As disclosed in JPH11-87804, the sensitivity of a giant magnetoresistive thin film is enhanced by providing soft magnetic thin films on both sides of the giant magnetoresistive thin film. In this arrangement, the sensitivity of a magnetic sensor is enhanced as the widths of soft magnetic thin films (soft magnetic bodies) become larger.

However, output noise in the long axis direction of the giant magnetoresistive thin film that is perpendicular to the direction of a magnetically sensitive axis (in this case, the direction of a short axis of the giant magnetoresistive thin film) in a magnetic field increases as the widths of the soft magnetic thin films (soft magnetic bodies) become larger.

The present invention aims at providing a magnetic sensor having an elongate element portion that is capable of reducing output noise in the long axis direction of the element portion.

A magnetic sensor of the present invention comprises at least an element portion that is elongate and that has a magnetoresistive effect; and a soft magnetic body that sandwiches the element portion on both sides with regard to a short axis direction of the element portion. A width of at least one of both end portions of the element portion with regard to a long axis direction of the element portion gradually decreases as a distance in the long axis direction from a central portion of the element portion with regard to the long axis direction increases.

According to the invention, it is possible to provide a magnetic sensor having an elongate element portion that is capable of reducing output noise in the long axis direction of the element portion.

The above and other objects, features and advantages of the present invention will become apparent from the following descriptions with reference to the accompanying drawings which illustrate examples of the present invention.

DETAILED DESCRIPTION OF EMBODIMENTS

Figure 1A:
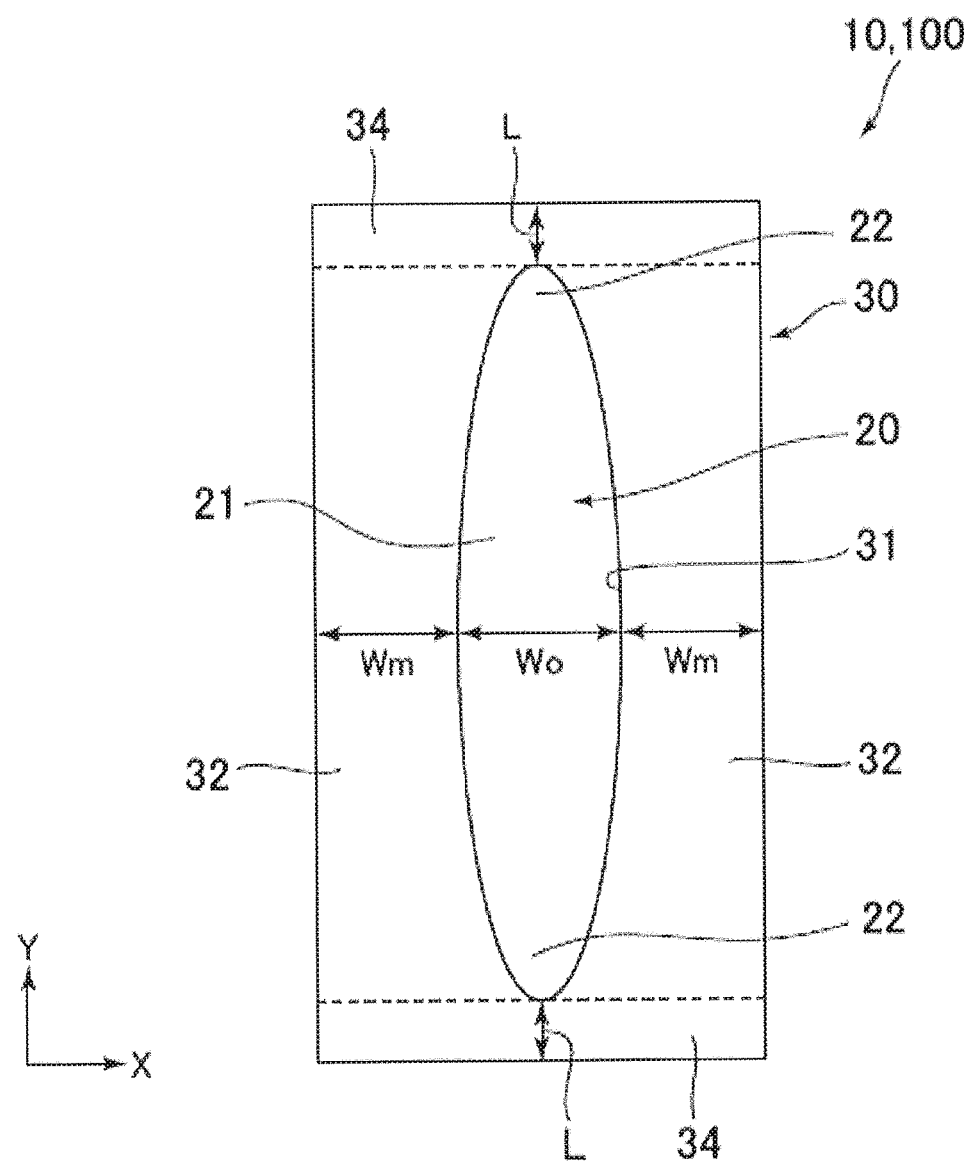
FIG. 1A is a plan view of the main portion of a magnetic sensor according to an embodiment.

Explanation will be given about an embodiment, as well as modifications of the embodiment. In the following descriptions, central portion 21 and both end portions 22 of element portion 20 are defined with regard to the direction of the long axis of the element portion. Therefore, central portion 21 means the central portion with regard to the direction of the long axis of the element portion 20, and end portion 22 mean the end portions with regard to the direction of the long axis of element portion 20. In addition, in the following descriptions, the widths of element portion 20 and end portion 22 are defined with regard to the direction of the short axis of the element portion. Therefore, the widths of element portion 20 and end portion 22 mean the widths of element portion 20 and end portion 22 with regard to the direction of the short axis of the element portion, respectively.

First Embodiment

Magnetic sensor 10 of the embodiment is, for example, a sensor for detecting the position of a moving object (not shown) having a magnet, that is, a positon sensor. Magnetic sensor 10 of the embodiment is configured to move relative to the above-mentioned magnet and thereby to detect a change in an external magnetic field that is generated by the magnet, and to calculate the moving distance of the moving object based on the change that is detected. Magnetic sensor 10 of the embodiment has a magnetically sensitive axis, which is the X axis in FIG. 1A, and detects a change in a magnetic field in the X axis direction that is generated by the moving object. In the following descriptions, the X axis in FIG. 1A (the axis parallel to the short axes of element portion 20 and soft magnetic body 30) is referred to as a first axis, and the Y axis in FIG. 1A (the axis parallel to the long axes of element portion 20 and soft magnetic body 30) is referred to as a second axis.

Figure 1B:
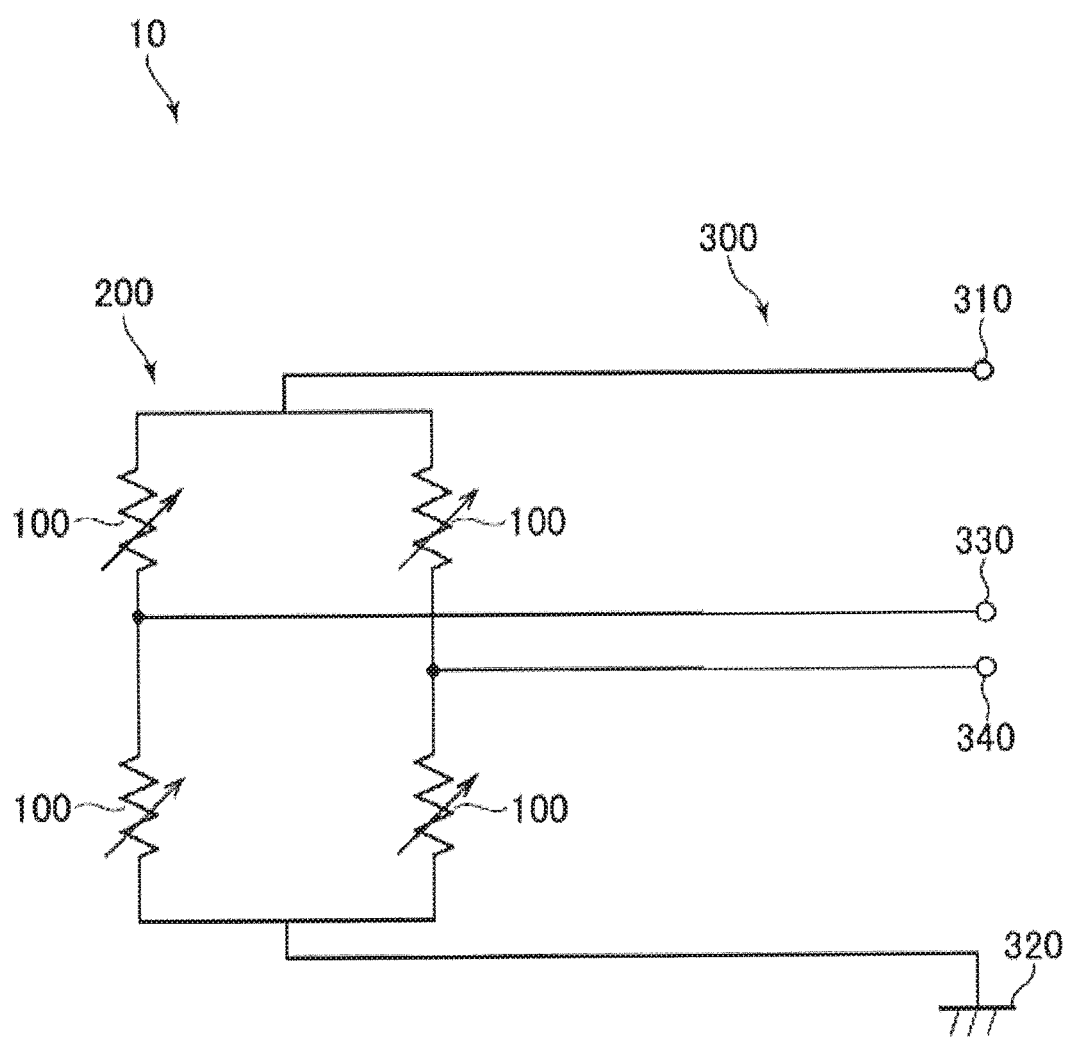
FIG. 1B is a circuit diagram of the magnetic sensor according to the embodiment.
Figure 1C:
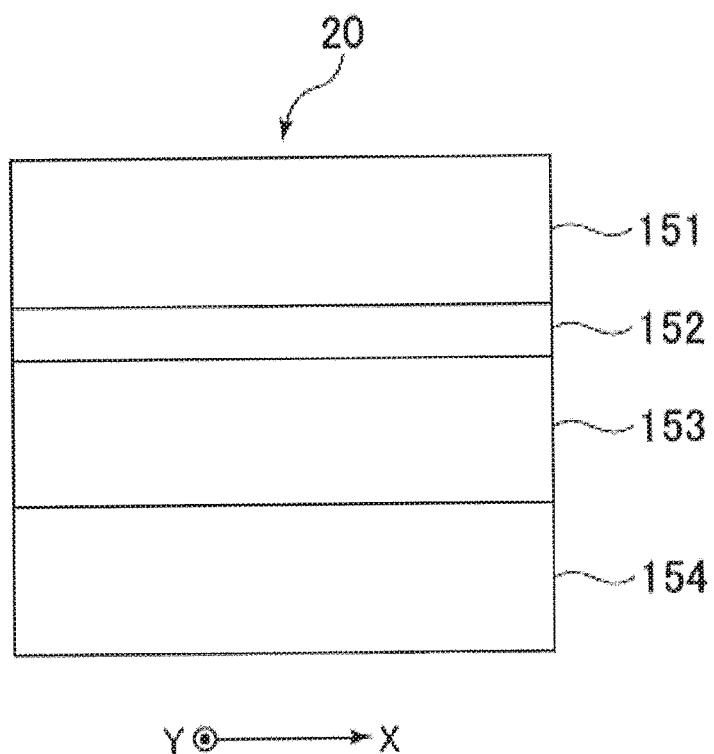
FIG. 1C is a sectional view of an element portion that constitutes the main portion of the magnetic sensor according to the embodiment.

Magnetic sensor 10 of the embodiment has magnetoresistive element portion 100 that is constructed by element portion 20 and soft magnetic body 30, as shown in FIG. 1A. As shown in FIG. 1B, magnetic sensor 10 of the embodiment has sensor portion 200, in which magnetoresistive element portions 100 are bridge-connected to each other, and integrated circuit 300 having input terminal 310 that is electrically connected to sensor portion 200, ground terminal 320 and external output terminals 330, 340 etc.

Element portion 20 is, for example, plate-like and includes a material that has a magnetoresistive effect, later described. Element portion 20 is oval, as viewed in the thickness direction. In other words, element portion 20 is elongate, as viewed in the thickness direction, i.e., a direction that is perpendicular both to the long axis direction and to the short axis direction of element portion 20 that is oval. The long axis direction of element portion 20 corresponds to the major axis of element portion 20 that is oval, and the short axis direction of element portion 20 corresponds to the minor axis of element portion 20 that is oval. Although conceptually illustrated in FIG. 1A for convenience, an actual example of element portion 20 has an elongate and oval shape having a length of about 20 μm in the long axis direction and a length of about 1 μm in the short axis direction. Since element portion 20 of the embodiment is oval, as mentioned above, the widths of end portions 22 of element portion 20 gradually decrease from center portion 21 and become zero at the tip ends thereof. In other words, the widths of end portions 22 gradually decrease as the distance in the long axis direction from the center of element portion 20 with regard to the long axis direction thereof increase.

Soft magnetic body 30 is, for example, elongate. Soft magnetic body 30 has aperture 31 that has the same shape (the same oval shape) as element portion 20. Soft magnetic body 30 surrounds element portion 20 without forming any gap between soft magnetic body 30 and element portion 20 in aperture 31, as viewed in the thickness direction of element portion 20 (and of soft magnetic body 30 itself). That is, soft magnetic body 30 is arranged without forming any gap at least between end portions 22 of element portion 20 and soft magnetic body 30. Element portion 20 and soft magnetic body 30 are arranged above a substrate (not shown).

Element portion 20 of the embodiment has, for example, a typical spin-valve type film configuration, as shown in FIG. 10. Specifically, element portion 20 includes free layer 151 whose magnetization direction is changed depending on an external magnetic field, pinned layer 153 whose magnetization direction is pinned relative to the external magnetic field, spacer layer 152 that is positioned between and that is in contact both with free layer 151 and with pinned layer 153, antiferromagnetic layer 154 that is adjacent to pinned layer 153 on the back side thereof, as viewed from spacer layer 152. Free layer 151, spacer layer 152, pinned layer 153 and antiferromagnetic layer 154 are stacked above the above-mentioned substrate. Antiferromagnetic layer 154 fixes the magnetization direction of pinned layer 153 by the exchange coupling with pinned layer 153. Pinned layer 153 may also have a synthetic structure in which two ferromagnetic layers sandwich a nonmagnetic intermediate layer. Spacer layer 152 is a tunneling barrier layer that is formed of a nonmagnetic insulator, such as $Al_2O_3$. Accordingly, element portion 20 of the embodiment functions as a tunneling magnetoresistive element (a TMR element). In other words, element portion 20 of the embodiment has a tunneling magnetoresistive effect. A TMR element is advantageous in that it has a larger MR ratio and a larger output voltage from the bridge circuit, for example, than a GMR element.

As shown in FIG. 1A, soft magnetic body 30 of the embodiment is, for example, rectangular, as viewed in the thickness direction. The major axis of aperture 31 that is oval is in parallel to the long axis direction of soft magnetic body 30. Accordingly, soft magnetic body 30 is in line symmetry, for example, with regard to the major axis (not shown) and the minor axis (not shown) of element portion 20, as shown in FIG. 1A.

Soft magnetic body 30, which is arranged around element portion 20, as mentioned above, has the function of enhancing the sensitivity of magnetic sensor 10 or the function as a yoke. Soft magnetic body 30 of the embodiment is formed, for example, of NiFe, CoFe, CoFeSiB, CoZrNb and the like.

In the following descriptions, portions of soft magnetic body 30 that are positioned outward of both ends of element portion 20 with regard to the long axis direction are referred to as outer regions 34, and the remaining portion of soft magnetic body 30 that is positioned between both ends of element portion 20 with regard to the long axis direction is referred to as inner region 32 (see FIG. 1A).

Although conceptually illustrated in FIG. 1A for convenience, in an actual example, minimum width Wm of inner region 32 is larger than maximum width W0 of element portion 20. Magnetic sensor 10 of the embodiment has a higher sensitivity than a magnetic sensor in which minimum width Wm of inner region 32 is equal to or less than maximum width W0 of element portion 20.

Length L of each outer region 34 is, for example, smaller than minimum width Wm of inner region 32. In addition, length L of each outer region 34 is, for example, smaller than maximum width W0 of soft magnetic body 30.

Figure 2:
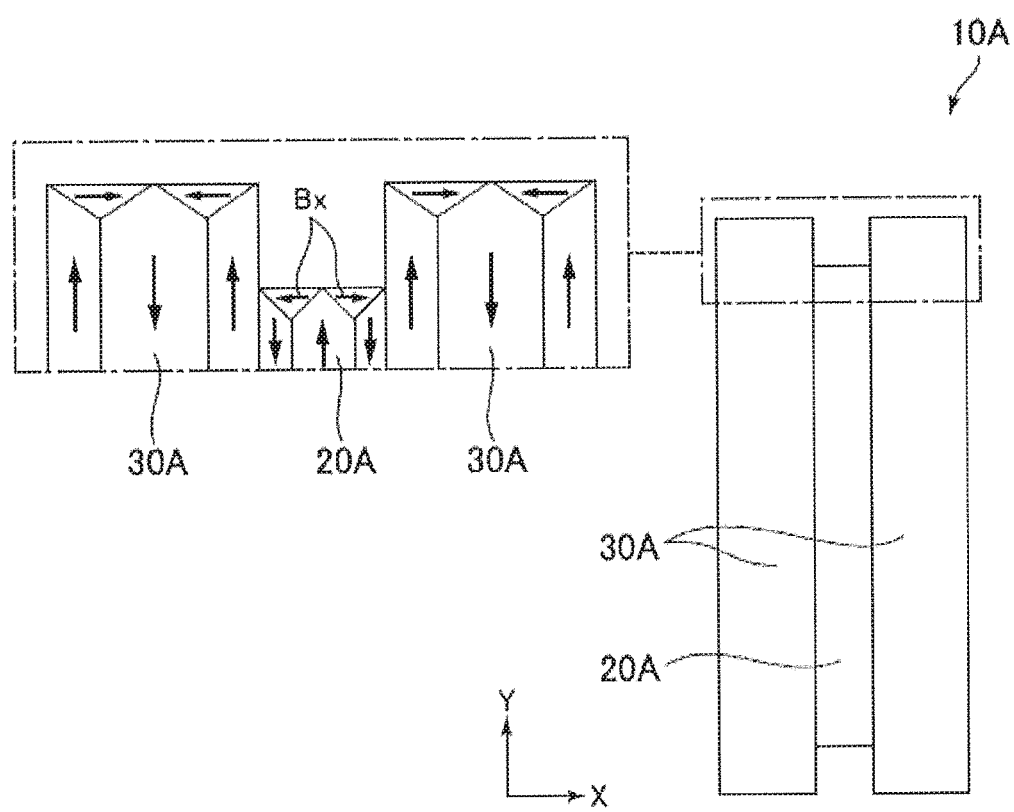
FIG. 2 is a plan view of the main portion of a magnetic sensor of a comparative example, illustrating the mechanism of generating output noise.
Figure 3:
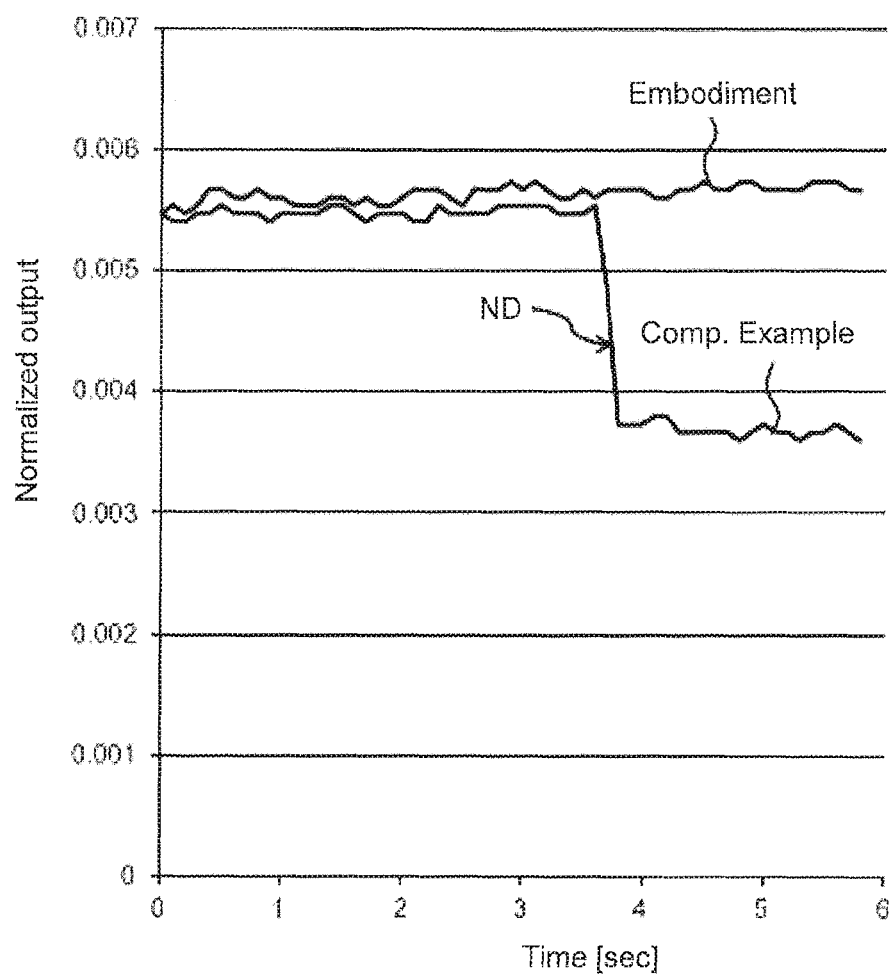
FIG. 3 is a graph showing the relationship between time duration for applying a magnetic field and a change in outputs of the sensors of the embodiment and the comparative example.

Next, the effect of the present embodiment will be explained by comparing the present embodiment (see FIG. 1A) to a comparative example (see FIG. 2). The comparison is conducted based on the measurement of output of each magnetic sensor versus time duration for applying a magnetic field of a predetermined strength to each magnetic sensor, as shown in the graph of FIG. 3. In the descriptions of the comparative example, when the same elements are used in the comparative example as in the present embodiment, the names and reference numerals in the present embodiment will be used.

The method of measurement will be explained with reference to FIG. 3

In the measurement, a magnetic field of a predetermined strength is applied to magnetic sensor 10 of the present embodiment and magnetic sensor 10A of the comparative example in the second axis direction. The outputs of magnetic sensors 10, 10A that are measured when the magnetic field is applied are recorded, for example, every 0.1 second. Then, the output spectra of magnetic sensors 10, 10A are compared. The spectrum of magnetic sensor 10 of the present embodiment and the spectrum of magnetic sensor 10A of the comparative example are shown in the graph of FIG. 3. In FIG. 3, output spectra are normalized such that half the difference between the maximum values and the minimum values of the outputs of respective magnetic sensors 10, 10A are 1.

It is preferable that a magnetic sensor having a magnetically sensitive axis in the X axis direction ideally outputs zero when a magnetic field is applied in the second axis direction. However, when a magnetic field is applied to the magnetic sensor in the second axis direction, unstable magnetic field component Bx that is directed in the first axis direction (see FIG. 2) is actually applied from soft magnetic body 30 to element portion 20. The magnetic sensor generates an output that is affected by the application of magnetic field component Bx. In other words, for each magnetic sensor 10, 10A, each spectrum in FIG. 3 corresponds to output noise that is caused by the magnetic field in the second axis direction.

Accordingly, it is preferable that the output spectrum of each magnetic sensor 10, 10A be as flat as possible with regard to the time duration. It is further preferable that the output be low and as close to zero as possible. In the following descriptions, the output noise due to the magnetic field in the second axis direction is simply referred to as "output noise".

COMPARATIVE EXAMPLE

The configuration of magnetic sensor 10A of the comparative example will be explained in detail with reference to FIG. 2. Magnetic sensor 10A of the comparative example has element portion 20A and a pair of soft magnetic bodies 30A instead of element portion 20 and soft magnetic body 30 of magnetic sensor 10 of the present embodiment. Element portion 20A is, for example, elongate and is rectangular, as viewed in the thickness direction. In other words, unlike the present embodiment, the widths of both end portions of element portion 20A of the comparative example do not gradually increase between the central portion and respective outer tip ends. The pair of soft magnetic bodies 30A is, for example, elongate and is arranged along both sides of element portion 20 that extend in the long axis direction. Magnetic sensor 10A of the comparative example has the same configuration as magnetic sensor 10 of the present embodiment (see FIG. 1A) except for the above.

Next, consideration will be given based on the comparison between the output spectrum of magnetic sensor 10 of the present embodiment and the output spectrum of magnetic sensor 10A of the comparative example.

Referring to the graph of FIG. 3, the output of the comparative example is sharply changed several seconds after the measurement started (in the graph of FIG. 3, three to four seconds after the measurement started). In other words, a jump occurs in the output spectrum. The "spectrum jump" is indicated by the reference sign ND in FIG. 3. To the contrary, any spectrum jump ND is not observed in the output spectrum of the present embodiment. Thus, magnetic sensor 10 of the present embodiment generates a smaller output noise than magnetic sensor 10A of the comparative example.

In the present descriptions, output noise whose output, which is normalized in the aforementioned manner, is changed at a rate of 0.001 or more per 0.1 (second), i.e., output noise whose output, which is normalized in the aforementioned manner, is changed at a rate of 0.1(%) or more per 0.1 (second) is defined to be the "spectrum jump ND" mentioned above. The inventor thinks that the reason why the output noise of the present embodiment is smaller than the output noise of the comparative example is as follows. Unlike the present embodiment, the widths of both end portions of element portion 20A of the comparative example do not decrease as the distance from the central portion toward both tip ends increases, and the tip ends are formed of flat planes that extend in the short axis direction of element portion 20 (see FIG. 2). Accordingly, unstable magnetic field component Bx in the short axis direction is generated in the end portion of element portion 20A, as shown in the enlarged view of FIG. 2. This is considered to cause spectrum jump ND in the output spectrum of the comparative example, as shown in FIG. 3.

To the contrary, in magnetic sensor 10 of the present embodiment, element portion 20 is formed into an oval shape having a major axis extending in the second axis direction, as viewed in the thickness direction of element portion 20 (see FIG. 1A). In other words, element portion 20 of the present embodiment is shaped such that the width gradually decreases as the distance in the long axis direction from the central portion increases, as viewed in the thickness direction. Therefore, unstable magnetic field component Bx (see FIG. 2) that is directed in the short axis direction, which occurs in the comparative example, is less apt to occur in end portions 22 of element portion 20 of the present embodiment, and even if it occurs, it is smaller than that of the comparative example. As a result, spectrum jump ND, which occurs in the comparative example, is not observed in the output spectrum of the present embodiment, as shown in FIG. 3.

Accordingly, magnetic sensor 10 of the present embodiment is capable of reducing output noise (or limiting spectrum jump ND). This effect is especially advantageous for the present embodiment because the output noise tends to increase for element portion 20 in which minimum width Wm of soft magnetic body 30 is larger than maximum width W0 of element portion 20. Furthermore, this effect is especially advantageous for the present embodiment because S/N ratio can be improved for element portion 20 having a tunneling magnetoresistive effect.

In magnetic sensor 10 of the present embodiment, soft magnetic body 30 surrounds element portion 20 in aperture 31 without forming any gap between element portion 20 and soft magnetic body 30. The effect arising from this configuration will be described later.

[First Modification]

Figure 4:
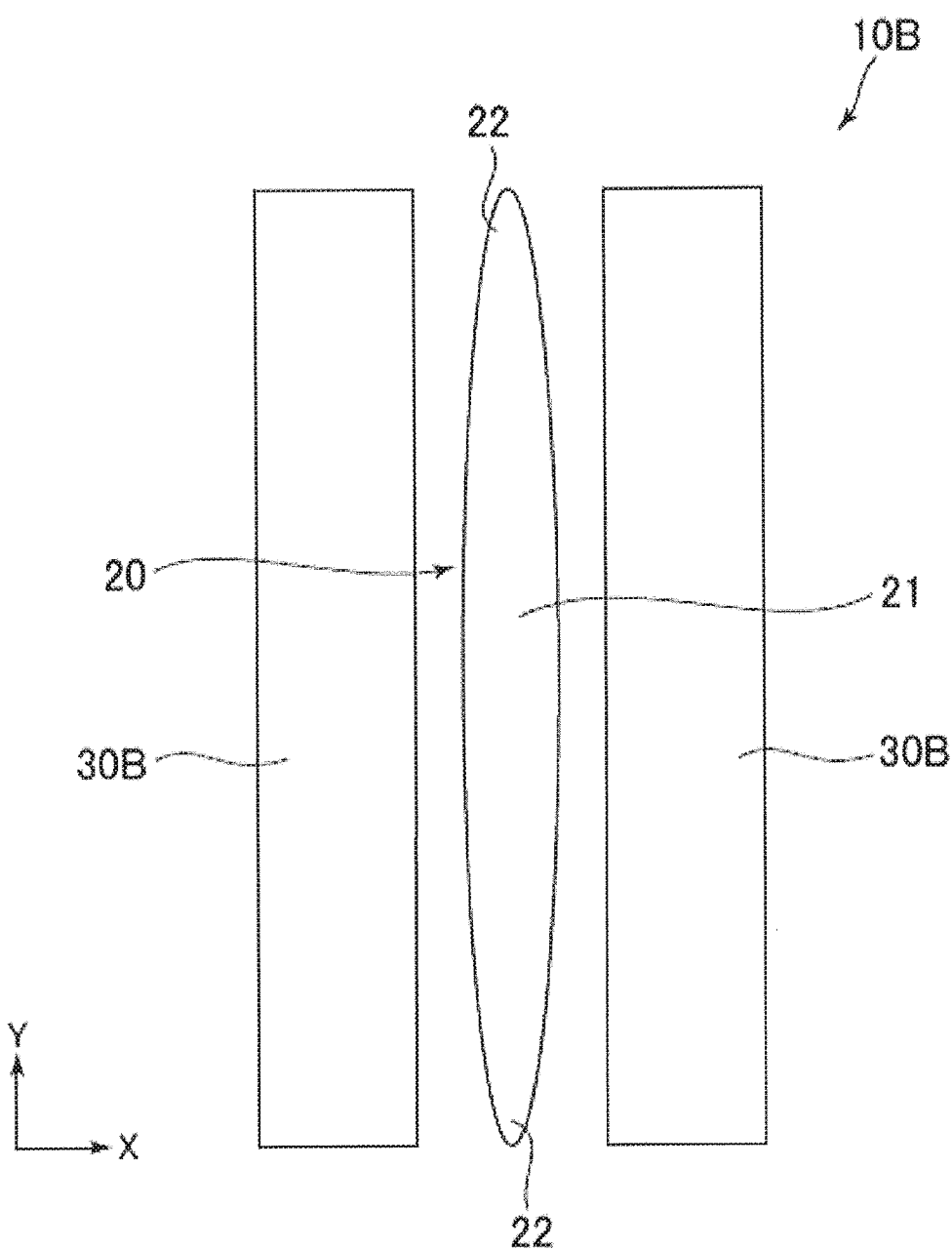
FIG. 4 is a plan view of the main portion of a magnetic sensor according to a first modification.

Next, magnetic sensor 10B of a first modification will be explained with reference to FIG. 4. FIG. 4 shows the configuration of magnetic sensor 10B of this modification.

In magnetic sensor 10B of this modification, soft magnetic body 30 of magnetic sensor 10 of the present embodiment is replaced with a pair of soft magnetic bodies 30B that is separated from element portion 20. Magnetic sensor 10B of this modification has the same configuration as magnetic sensor 10 of the present embodiment except for the above.

The output noise of magnetic sensor 10B of this modification (not shown) is about the same level as the output noise of magnetic sensor 10 of the present embodiment (see the graph of FIG. 3). In this modification, spectrum jump ND, which is observed in the comparative example (see FIG. 3), was not observed.

From the foregoing, magnetic sensor 10B of this modification is capable of reducing output noise (or limiting spectrum jump ND), as compared to magnetic sensor 10A of the comparative example mentioned above. The inventor thinks that the reason why this modification has the same effect as the present embodiment is that magnetic field component Bx, which is described with reference to FIG. 2, is less apt to occur because this modification has the same element portion 20 as the present embodiment.

It is found from the measurement of this modification that this modification is capable of reducing output noise in the same manner as the present embodiment but is less sensitive than the present embodiment (not shown). The inventor thinks that the reason is that, unlike this modification, soft magnetic body 30 of the present embodiment surrounds element portion 20 in aperture 31 without any gap and hence magnetic field component Bx is less apt to occur.

From the foregoing, magnetic sensor 10 of the present embodiment is more sensitive than magnetic sensor 10B of this modification. In other words, magnetic sensor 10 of the present embodiment is capable of reducing output noise while enhancing sensitivity, as compared to magnetic sensor 10A of the comparative example mentioned above.

[Second Modification]

Figure 5:
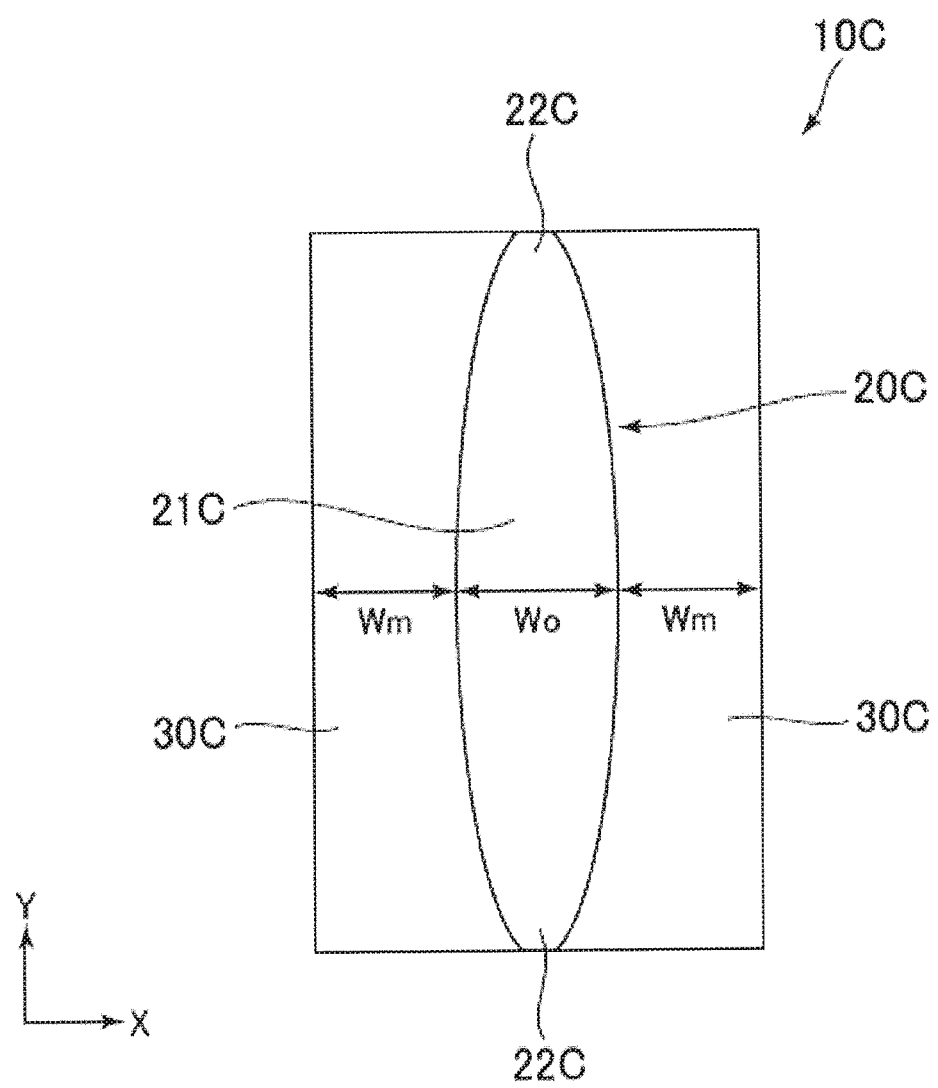
FIG. 5 is a plan view of the main portion of a magnetic sensor according to a second modification.

Next, magnetic sensor 10C of the second modification will be explained with reference to FIG. 5. Magnetic sensor 10C of this modification is shape such that both end portions of magnetic sensor 10 of the present embodiment with regard to the long axis direction thereof (the long axis direction of element portion 20) are cut along lines parallel to the minor axis direction of element portion 20. Specifically, in element portion 20C of this modification, the contour of element portion 20C other than both tip ends forms a part of an oval, as viewed in the thickness direction of element portion 20C. In other words, the widths of end portions 22C of element portion 20C of this modification gradually decrease from the central portion 21C but do not become zero at both tip ends.

In addition, magnetic sensor 10C of this modification is shaped as if one soft magnetic body were cut into a pair of soft magnetic bodies 30C. The pair of soft magnetic bodies 30C of this modification is arranged on both sides of element portion 20C with regard to the minor axis direction thereof without forming any gap between soft magnetic bodies 30C and element portion 20C on both sides of element portion 20C with regard to the minor axis direction thereof, as viewed in the thickness direction of element portion 20C. In other words, the pair of soft magnetic bodies 30C sandwiches element portion 20C from both sides in the X direction and does not form any gap between element portion 20C and soft magnetic bodies 30C except for the tip ends of end portions 22C with regard to the Y axis direction. Magnetic sensor 10C of this modification has the same configuration as magnetic sensor 10 of the present embodiment (see FIG. 1A) except for the above.

Element portion 20C of this modification has an oval-like shape that is not oval but is almost oval, as viewed in the thickness direction. Unlike element portion 20A of the comparative example (see FIG. 2) mentioned above, the widths of both end portions of element portion 20C of this modification gradually decrease between the central portion and respective tip ends. Thus, in end portions 22C of element portion 20C of this modification, unstable magnetic field component Bx in the short axis direction that occurs in the comparative example (see FIG. 2) is less apt to occur, and even if it occurs, it is smaller than that of the comparative example. Therefore, according to the present modification, magnetic field component Bx is less apt to occur, spectrum jump ND does not occur and the output noise is limited.

In addition, unlike magnetic sensor 10B of the comparative example mentioned above (see FIG. 4), element portion 20C of this modification does not form any gap between soft magnetic bodies 30C and element portion 20C. Thus, magnetic sensor 10C of this modification is more sensitive than magnetic sensor 10B of the first modification.

From the foregoing, magnetic sensor 10C of this modification is capable of reducing output noise while enhancing sensitivity because element portion 20 is formed into an oval shape having a minor axis parallel to the first axis direction, and there is no gap formed between element portion 20C and soft magnetic bodies 30C, as viewed in the thickness direction.

In addition, unlike the present embodiment (see FIG. 1A), both soft magnetic bodies 30C of magnetic sensor 100 of this modification are not connected to each other outward of both tip ends of element portion 20C with regard to the long axis direction. Thus, in magnetic sensor 10C of this modification, magnetic flux is prevented from flowing from one of inner regions 32 of soft magnetic bodies 30 to the other via outer region 34, unlike magnetic sensor 10 of the present embodiment.

Therefore, magnetic sensor 10C of this modification is advantageous in that a magnetic field in the short axis direction is less apt to flow from soft magnetic body 30C on one side of element portion 20C with regard to the short axis direction to magnetic body 30C on the other side of element portion 20C and is more apt to be applied to element portion 20C, as compared to magnetic sensor 10 of the present embodiment.

The embodiment and some modifications have been described. However, the present invention is not limited to the embodiment and the modifications mentioned above. For example, the following modifications are included in the scope of the present invention.

Figure 6A:
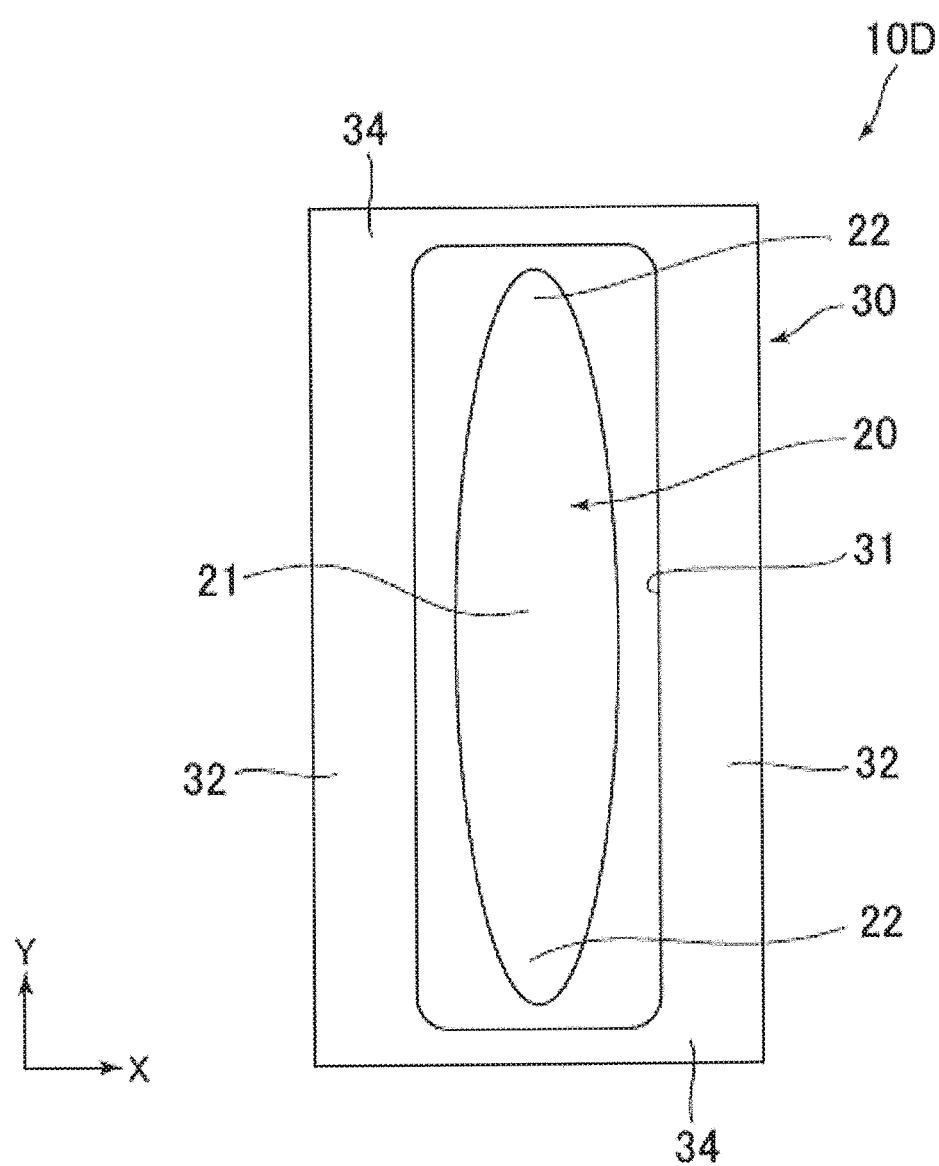
FIG. 6A to 6E are plan views of the main portions of magnetic sensors according to third to seventh modifications, respectively.

For example, element portion 20 has the same shape as aperture 31 of soft magnetic body 30 in the embodiment (see FIG. 1A). However, element portion 20 does not have to have the same shape as aperture 31 of soft magnetic body 30 as long as element portion 20 is shaped such that the width gradually decreases between the central portion and each tip end and element portion 20 is arranged in aperture 31. For example, as shown FIG. 6A illustrating magnetic sensor 10D of a third modification, aperture 31 may be rectangular, as viewed in the thickness direction. This modification is also capable of reducing output noise, as compared to the above-mentioned comparative example.

Figure 6B:
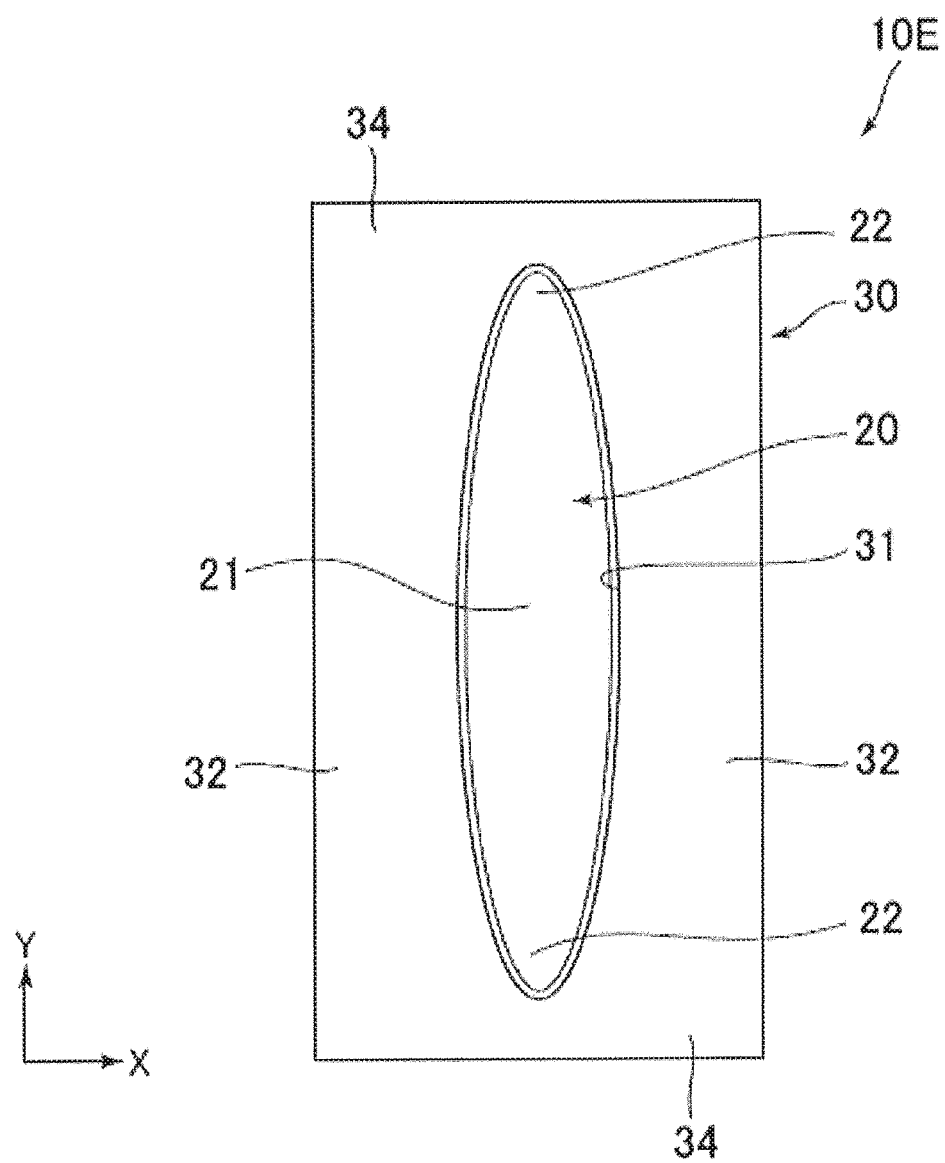
Figure 6C:
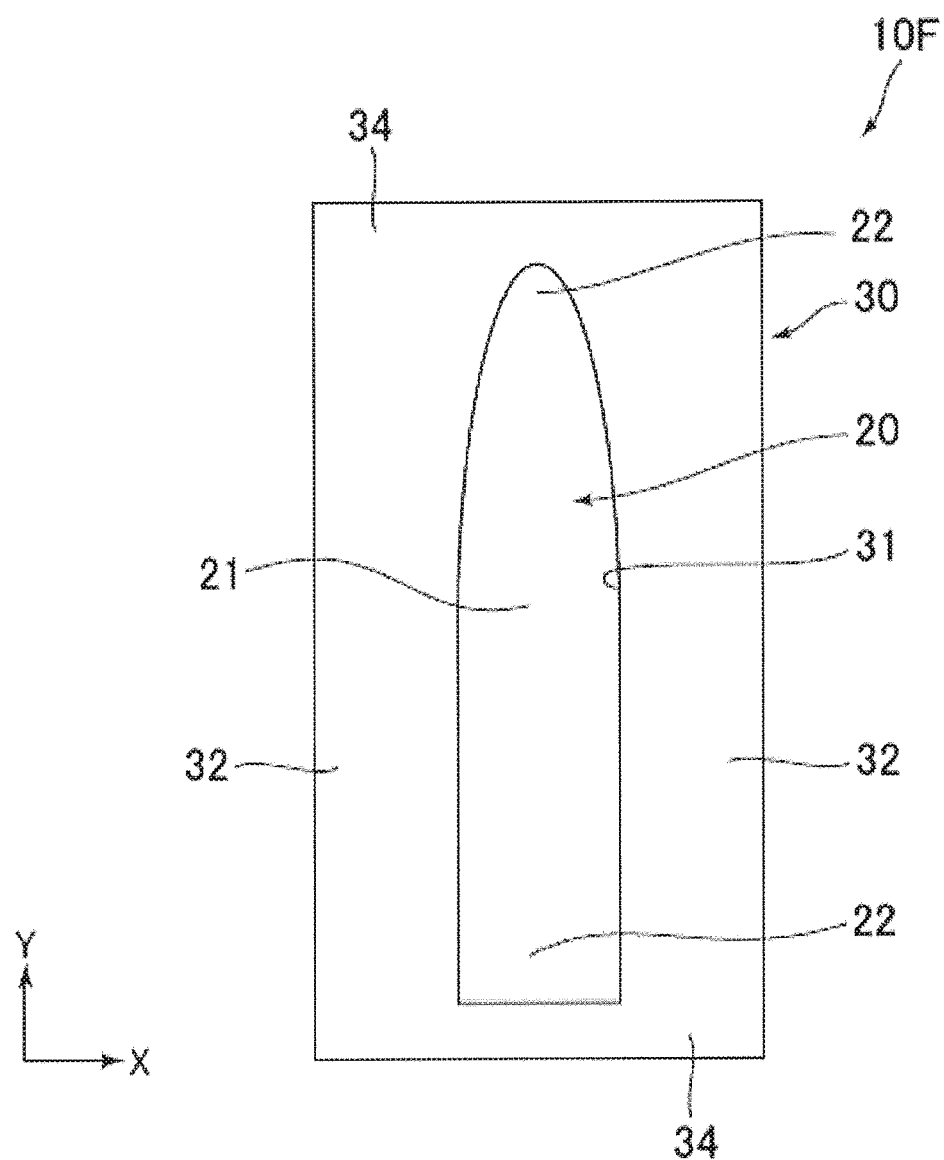
Figure 6D:
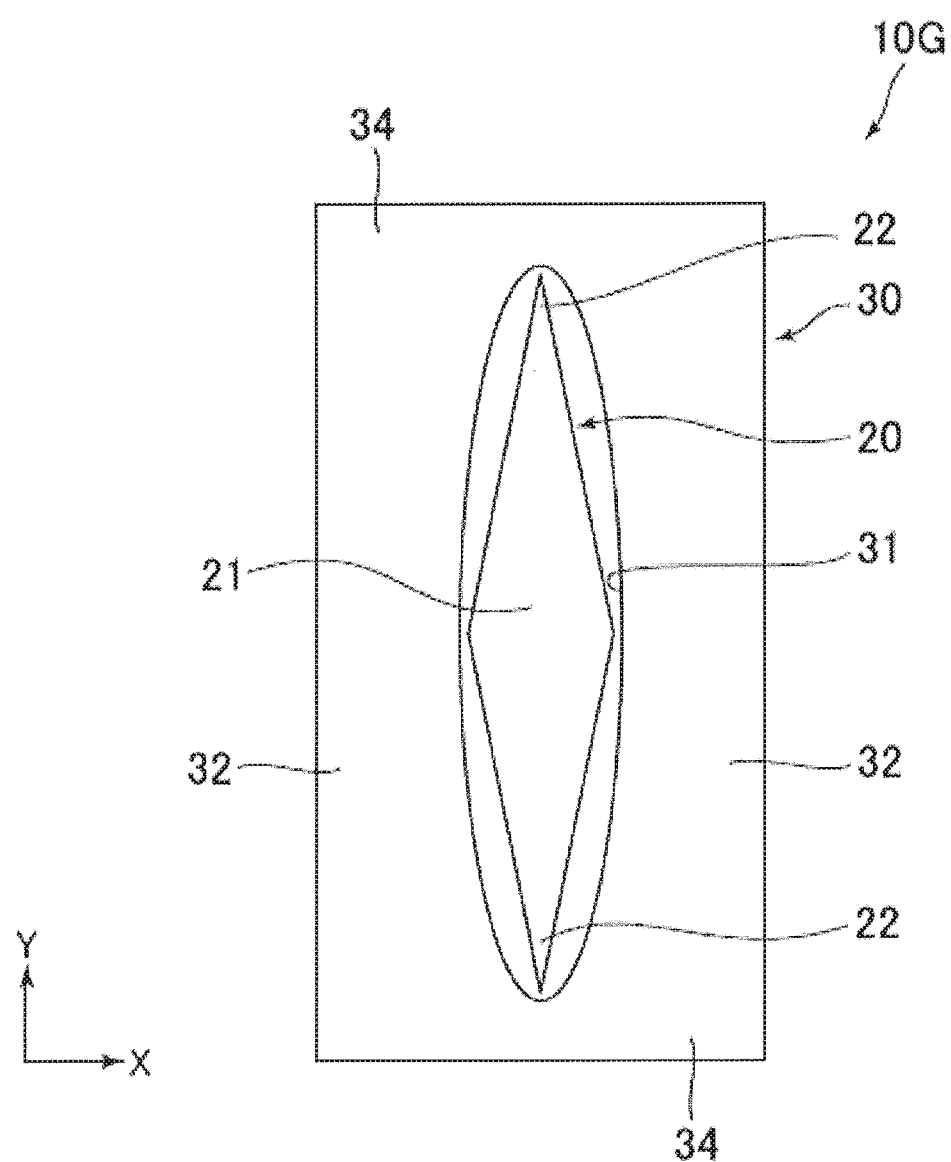

In the embodiment, soft magnetic body 30 is arranged without forming any gap between element portion 20 and soft magnetic body 30 (see FIG. 1A). However, a gap may be formed between element portion 20 and soft magnetic body 30, as shown in FIG. 6B illustrating magnetic sensor 10E of a fourth modification and in FIG. 6D illustrating magnetic sensor 10G of a sixth modification as long as element portion 20 is shaped such that the width gradually decreases between the central portion and each tip end. This modification is also capable of reducing output noise, as compared to the above-mentioned comparative example.

In the embodiment, element portion 20 has an oval shape having a major axis that is perpendicular to the magnetically sensitive axis. That is, the widths of both end portions 22 of element portion 20 gradually decrease between the central portion and respective tip ends (see FIG. 1A). However, as shown in FIG. 6C illustrating magnetic sensor 10F of a fifth modification, magnetic sensor 10F may be shaped such that the width of only one of element portions 20 decreases between the central portion and the tip end. This modification is also capable of reducing output noise, as compared to the above-mentioned comparative example, in which the widths are constant between the central portion and both tip ends (see FIG. 2). Accordingly, this modification is capable of reducing output noise while enhancing sensitivity.

Element portion 20 has the same shape as aperture 31 of soft magnetic body 30 in the embodiment (see FIG. 1A). However, as shown in FIG. 6D illustrating magnetic sensor 10G of the sixth modification, magnetic sensor 10G may be shaped such that element portion 20 has a shape that is different from that of aperture 31 of soft magnetic body 30 as long as element portion 20 is shaped such that the width gradually decreases between the central portion and the tip ends. This modification is also capable of reducing output noise, as compared to the above-mentioned comparative example.

Figure 6E:
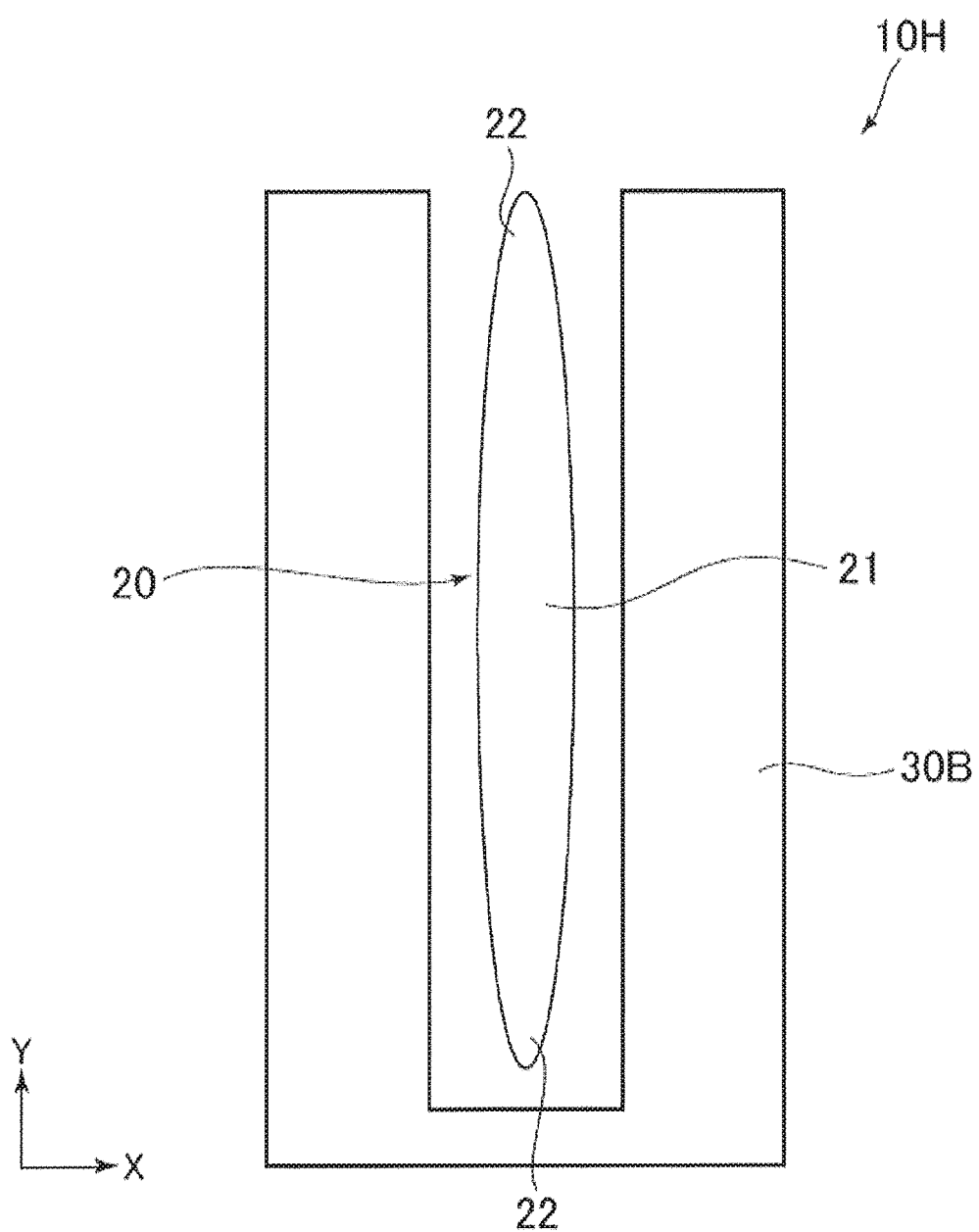

In the first modification, a pair of soft magnetic bodies 30B is arranged such that soft magnetic bodies 30B sandwich element portion 20 from both sides of the short axis thereof. However, a soft magnetic body does not have to be formed into a pair of soft magnetic bodies as long as a soft magnetic body is arranged such that it sandwiches element portion 20. For example, as shown in FIG. 6E illustrating magnetic sensor 10H of a seventh modification, soft magnetic body 30B may be U-shaped. This modification is also capable of reducing output noise, as compared to the above-mentioned comparative example.

In the embodiment, the spacer layer that constitutes element portion 20 is a tunneling barrier layer, and element portion 20 is a TMR element. However, the spacer layer that constitutes element portion 20 may be a nonmagnetic conductive layer that is formed of a nonmagnetic metal, such as Cu, in order to form element portion 20 as a giant magnetoresistive element (GMR element). Element portion 20 may also be an anisotropic magnetoresistive element (AMR element). These modifications are also capable of reducing output noise while enhancing sensitivity, as compared to the comparative example.

In the embodiment, minimum width Wm of inner region 32 of soft magnetic body 30 is larger than maximum width W0 of element portion 20 (see FIG. 1A). However, minimum width Wm of inner region 32 may be equal to or smaller than maximum width W0 of element portion 20. Taking into account that output noise occurs as a trade-off for enhancing the sensitivity of magnetic sensor 10 by providing soft magnetic body 30, the modification also has the effect of the above-mentioned embodiment.

An embodiment in which one from among the embodiment and the first to seventh modifications is combined with an element of other embodiment/modifications is also included in the scope of the present invention. For example, a modification of magnetic sensor 10H according to the seventh modification (see FIG. 6E), in which element portion 20 is replaced with the element (rhomb element portion 20) according to the sixth modification, is included in the scope of the present invention.

Magnetic sensor 10 of the embodiment has been described by taking a position sensor as an example. However, magnetic sensor 10 of the embodiment may be a sensor other than a positon sensor as long as magnetic sensor 10 detects a magnetic field that is applied in the first axis direction. For example, magnetic sensor 10 may be a sensor, such as an angle sensor and encoder.

Although certain preferred embodiments of the present invention have been shown and described in detail, it should be understood that various changes and modifications may be made without departing from the spirit or to scope of the appended claims.

What is claimed is:

1. A magnetic sensor comprising:
   an element portion that is elongate and that has a magnetoresistive effect, wherein the element portion is made of stacked layers and has a magnetically sensitive axis in a short-axis direction of the element portion, as viewed in a direction perpendicular to a long-axis direction and the short-axis direction of the element portion; and
   at least one soft magnetic body that sandwiches the element portion on both sides of the element portion with regard to the short-axis direction thereof, and the soft magnetic body is magnetized in an in-plane direction of the layers,
   wherein a width of at least one of end portions of the element portion with regard to the long-axis direction thereof gradually decreases as a distance in the long-axis direction from a central portion of the element portion with regard to the long-axis direction increases.

2. The magnetic sensor according to claim 1, wherein widths of the end portions of the element portion with regard to the long-axis direction thereof gradually decrease as the distance in the long-axis direction from the central portion increases.

3. The magnetic sensor according to claim 1, wherein the width of the at least one end portion gradually decreases as the distance in the long-axis direction from the central portion increases, and the width becomes zero at a tip end of the element portion.

4. The magnetic sensor according to claim 1, wherein the element portion is oval, as viewed in a direction that is perpendicular both to the long-axis direction and to the short-axis direction.

5. The magnetic sensor according to claim 1, wherein the soft magnetic body has an aperture, and the element portion is arranged in the aperture.

6. The magnetic sensor according to claim 1, wherein the soft magnetic body is arranged without forming any gap at least between the at least one end portion and the soft magnetic body, as viewed in a direction that is perpendicular both to the long-axis direction and to the short-axis direction.

7. The magnetic sensor according to claim 1, wherein the soft magnetic body is arranged such that it forms a gap between the element portion and the soft magnetic body, as viewed in a direction that is perpendicular both to the long-axis direction and to the short-axis direction.

8. The magnetic sensor according to claim 1, wherein the at least one soft magnetic body is a pair of soft magnetic bodies, and the pair of the soft magnetic bodies is arranged such that the soft magnetic bodies sandwich the element portion from both sides with regard to the short-axis direction of the element portion.

9. The magnetic sensor according to claim 8, wherein the pair of the soft magnetic bodies is arranged without forming any gap between at least the end portion and the soft magnetic bodies, as viewed in a direction that is perpendicular both to the long-axis direction and to the short-axis direction.

10. The magnetic sensor according to claim 8, wherein the pair of the soft magnetic bodies is arranged such that the soft magnetic bodies form a gap between the element portion and the soft magnetic bodies, as viewed in a direction that is perpendicular both to the long-axis direction and to the short-axis direction.

11. The magnetic sensor according to claim 1, wherein the element portion exhibits a tunneling magnetoresistive effect.

12. The magnetic sensor according to claim 1, wherein the element portion exhibits a giant magnetoresistive effect.

13. The magnetic sensor according to claim 1, wherein the soft magnetic body functions as a yoke.

14. The magnetic sensor according to claim 1, wherein the soft magnetic body reduces output noise of the magnetic sensor, and the output noise is caused by a magnetic field that is applied in the long axis direction of the element portion.

15. The magnetic sensor according to claim 1, wherein a gap is provided between the soft magnetic body and the element portion.

16. The magnetic sensor according to claim 1, wherein the element portion is included in a sensor portion to which output terminals are connected, and the shape of the element portion reduces output noise at the output terminals in the in the long-axis direction of the element portion.

* * * * *